United States Patent [19]

Ohhinata et al.

[11] 4,041,332
[45] Aug. 9, 1977

[54] SEMICONDUCTOR SWITCH DEVICE

[75] Inventors: Ichiro Ohhinata, Yokohama; Shinzi Okuhara, Fujisawa; Michio Tokunaga, Zushi, all of Japan

[73] Assignee: Hitachi, Ltd., Japan

[21] Appl. No.: 599,135

[22] Filed: July 25, 1975

[30] Foreign Application Priority Data

July 26, 1974 Japan .................................. 49-85151

[51] Int. Cl.² ............................................. H03K 17/72
[52] U.S. Cl. .......................... 307/252 J; 307/252 D; 307/252 N; 307/305
[58] Field of Search ............ 307/252 A, 252 J, 252 N, 307/202, 299, 305, 252 D, 252 G; 357/38; 323/225 C; 179/15 AT

[56] References Cited

U.S. PATENT DOCUMENTS 3,714,443  1/1973  Ogawa .......................... 307/252 A Primary Examiner—John Zazworsky
Attorney, Agent, or Firm—Craig & Antonelli

[57] ABSTRACT

A semiconductor switch device comprising a PNPN switch having an equivalent four-layer structure, a transistor, two impedance elements and a capacitive element, wherein the transistor and one of the impedance elements are connected in parallel with each other, the parallel circuit thus formed is connected between the P base and the N cathode of the PNPN switch, the capacitive element is connected between the base of the transistor and a terminal maintained at a constant potential, and the other impedance element is connected between the base and the emitter of the transistor, whereby the semiconductor switch has a high tolerance to dv/dt and can be closed with high sensitivity.

11 Claims, 6 Drawing Figures

SEMICONDUCTOR SWITCH DEVICE

The present invention relates to a semiconductor switch device used as a speech path switch of a telephone exchange and more particularly to a semiconductor switch device which has a high tolerance to dv/dt and can be closed with high sensitivity.

The PNPN switch having control terminals finds its broad use in a variety of control circuits since it has the following merits: heavy current can be controlled with a small control voltage, it has a self-holding action, it has a high bidirectional blocking voltage, and it has a large ratio of off-to on-impedance. In an example in which some of the above mentioned merits are utilized, the PNPN switch is used as a speech path switch. However, if a suddenly changing forward voltage is applied between the anode and the cathode of the PNPN switch while it is being cut off, it is erroneously closed. This phenomenon is known as rate effect (or dv/dt effect) and there have been proposed various method to prevent the effect. In general, there are two prevailing methods: one is as shown in FIG. 1 where a bypass resistor 2 is connected between the cathode K and the cathode gate $G_K$ of the PNPN switch 1 while the other is depicted in FIG. 2 where a resistor 2 is connected between the anode gate $G_A$ and a high potential source so as to apply a reverse bias voltage between the anode A and the anode gate $G_A$. However, these methods for preventing the rate effect are not effective in the case where the PNPN switch is used as a speech path switch. In case where a plurality of PNPN switches are connected in the form of a matrix to serve as speech path switches, the variation not only of the anode potential but also of the cathode potential contributes to the rate of change in voltage with respect to time, i.e. $dv/dt$. When the cathode potential changes, not only the charging current into the PN junction capacitance $C_{J2}$ of the PNPN switch 1 shown in FIG. 1 or 2 but also the discharge current from the stray capacitance $C_F$, flows into the cathode gate $G_K$. And since the stray capacitance is usually rather large, i.e. several tens of picofarad, the erroneous closure of the switch takes place very easily. For example, according to the method as shown in FIG. 1, when the PN junction capacitance $C_{J2}$ is 2PF and the stray capacitance is 5PF, the resistor to prevent the rate effect must have a resistance of less than 200Ω so as to obtain the tolerance to dv/dt of 500 V/μs. With this resistor having a low resistance, the gate control current enough to prevent the rate effect is 3 mA even in the above example, which leads to considerable power consumption. On the other hand, the method shown in FIG. 2 has the following drawbacks: the resistor 2 must be connected at a potential higher than the potential at the anode, and when the potential at the anode changes to higher levels, the erroneous closure is prevented while it cannot be avoided when the cathode potential changes to lower levels.

Therefore, one object of the present invention is to provide a semiconductor switch device having an equivalent four-layer structure of P, N, P and N regions, which has a high tolerance to dv/dt independent of the anode or cathode potential.

Another object of the present invention is to provide a semiconductor switch device having an equivalent four-layer structure of P, N, P and N regions, which has a high tolerance to dv/dt and a high bidirectional blocking voltage.

An additional object of the present invention is to provide a semiconductor switch device having an equivalent four-layer structure of P, N, P and N regions, which cannot be closed with a small control current.

A further object of the present invention is to provide a semiconductor switch device having an equivalent four-layer structure of P, N, P and N regions, which is free from the erroneous closure due to the stray capacitance of the gate control circuit.

Yet another object of the present invention is to provide a semiconductor switch device having an equivalent four-layer structure of P, N, P and N regions, which is adapted for high speed switching.

According to the present invention, therefore, there is provided a semiconductor switch device comprising a PNPN switch having an equivalent four-layer structure of P, N, P and N regions and three PN junctions; a transistor; two impedance elements; and a capacitive element, wherein the transistor and one of the two impedance elements are connected in parallel with each other, the parallel circuit thus formed is so connected as to shunt one of the three PN junctions of the PNPN switch which is at one extreme end, fixed potential is applied through the capacitive element to the base of the transistor, and the other impedance element is connected between the base and the emitter of the transistor.

The other objects and advantages of the present invention will become more apparent from the detailed descriptions of the embodiments according to the present invention taken in conjunction with the drawings in which.

Figure 3:
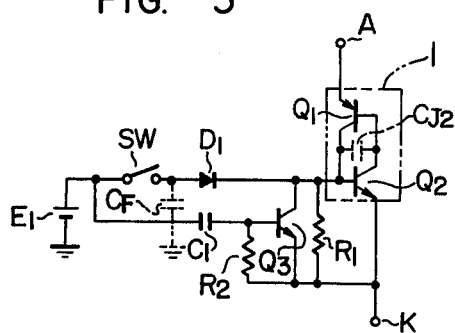
FIG. 3 is an equivalent circuit of a semiconductor switch as a first embodiment of the present invention.

In FIG. 3 showing an equivalent circuit of a semiconductor switch as a first embodiment of the present invention, a PNP transistor $Q_1$ and an NPN transistor $Q_2$ constitute a PNPN switch 1; a resistor $R_1$ and a transistor $Q_3$ serve respectively to prevent small and large dv/dt effects; a capacitance $C_1$ functions to transiently drive the transistor $Q_3$ from the side of the gate control circuit; a resistor $R_2$ provides a discharging path for the electric charges accumulated in the capacitor $C_1$ and the transistor $Q_3$; and $C_{J2}$, $C_F$, $E_1$, SW and $D_1$ designate the junction capacitance of the PNPN switch 1, the stray capacitance of the gate control circuit, a power supply of the gate control circuit, a switch and a diode for blocking backward current, respectively.

Figure 1:
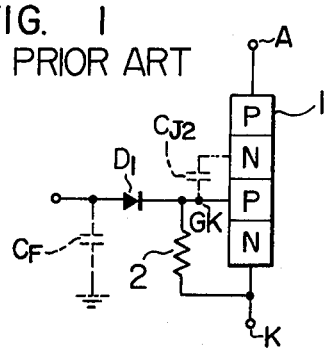
FIGS. 1 and 2 are circuits of semiconductor switches whose PNPN switches are provided with means for improving the tolerance to dv/dt.
Figure 2:
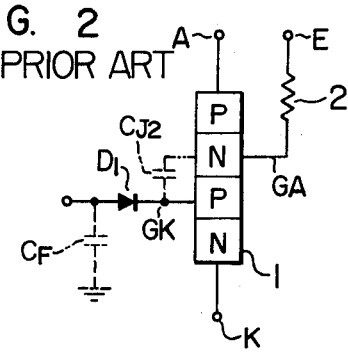

The PNPN switch 1 having such a structure as described above has a positive feedback loop: base of transistor $Q_2$ — collector of transistor $Q_2$ — base of transistor $Q_1$ — collector of transistor $Q_1$ — base of transistor $Q_2$, so that when gate current is drawn into the gate, the transistors $Q_1$ and $Q_2$ are driven into the active state and when the gain of the positive feedback loop exceeds unity, the transistors $Q_1$ and $Q_2$ suddenly perform switching operations. Consequently, the transistors $Q_1$ and $Q_2$ are simultaneously rendered conductive, a conduction path is established between the anode and the cathode, and this state is held. Although both the change in the anode potential and the change in the cathode potential contribute to the rate effect, the change in the cathode potential more often causes an erroneous firing of the PNPN switch in case of cathode gate drive than the change in the anode potential since the stray capacitance $C_F$ of the gate control circuit has a considerable influence in that case. In the circuit shown in FIG. 3, however, when the cathode potential is changed, the transistor $Q_3$ for preventing the dv/dt effect is driven through the capacitor $C_1$ and the electric charges released from the stray capacitance $C_F$ are absorbed. It is necessary in this case that the transistor $Q_3$ is saturated and that the collector-emitter saturation voltage is lower than the forward ON voltage between the cathode and the cathode gate of the PNPN switch. The resistor $R_2$ connected between the base and the emitter of the transistor $Q_3$ is essential for releasing the accumulated charges, but this resistor $Q_3$ also prevents the transistor $Q_3$ from turning on in response to a small dv/dt in cathode potential. Therefore, the resistor $R_1$ plays the role of preventing small dv/dt effect inclusive of the displacement current from the junction capacitance $C_{J2}$ of the PNPN switch. Since this resistor $R_1$ has only to prevent the effect of small dv/dt in case where the cathode potential changes, the resistance of the resistor $R_1$ can be higher in this case than that of the resistor $R_1$ in the conventional circuit shown in FIG. 1. Moreover, the dv/dt effect due to the change in the anode potential can be prevented by the resistor $R_1$ as in the conventional case. Since the transistor $Q_3$ is driven through the capacitor $C_1$ and being cut off in the steady state, the gate sensitivity is never deteriorated. Thus, according to the present invention, there is obtained a semiconductor switch device having a PNPN structure, in which the displacement current due to the stray capacitance of the gate control circuit is absorbed by a variable-impedance bypass circuit having a high impedance in the steady state and a low impedance in the transient state and which has a high sensitivity and a high tolerance to dv/dt against the potential changes in both anode and cathode.

Figure 4:
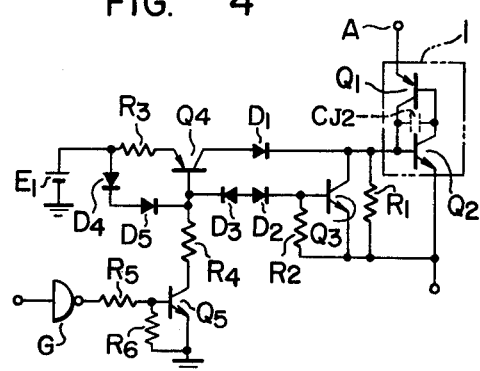
FIG. 4 is an equivalent circuit of a semiconductor switch as a second embodiment of the present invention.

FIG. 4 is an equivalent circuit of a semiconductor switch device as a second embodiment of the present invention. In FIG. 4, $Q_1$, $Q_2$, $Q_3$, $R_1$, $R_2$, $D_1$ and $E_1$ designate the same circuit elements as in the circuit in FIG. 3, and $Q_4$ and $Q_5$ indicate transistors; $R_3$, $R_4$, $R_5$ and $R_6$ resistors; $D_2$, $D_3$, $D_4$ and $D_5$ diodes; and G a logic circuit. In this circuit, the transistor $Q_4$, the diodes $D_4$ and $D_5$ and the resistor $R_3$ constitute a constant current circuit for driving the cathode gate while the circuit consisting of the transistor $Q_5$, the resistors $R_4$, $R_5$ and $R_6$ and the logic circuit serves to perform the ON-OFF control of the above mentioned constant current circuit, the diode $D_3$ preventing from the gate control circuit the dv/dt effect through the diode $D_2$ serving to block reverse current and transiently driving the transistor $Q_3$. Thus, the circuit shown in FIG. 4 uses a constant current circuit as the gate control circuit and a diode $D_3$ as the capacitive element to transiently drive the transistor $Q_3$. Since the capacitive element has only to be connected at a fixed potential, the cathode of the element in FIG. 4 is connected with the cathode of the diode $D_5$, but it may be connected with the anode of the diode $D_5$.

Figure 5:
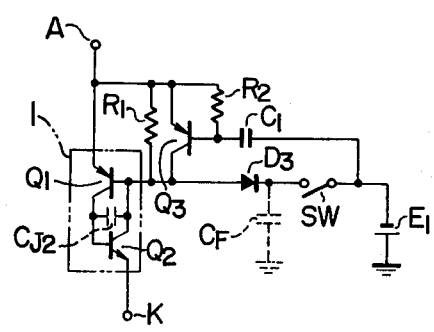
FIG. 5 is an equivalent circuit of a semiconductor switch as a third embodiment of the present invention.

FIG. 5 is an equivalent circuit of a semiconductor switch device as a third embodiment of the present invention, which is complementary in structure to the embodiment shown in FIG. 3. With this PNPN switch which is driven through the anode gate, due to the stray capacitance $C_F$ of the gate control circuit, the change in the anode potential more often causes erroneous closure than that in the cathode potential, which is contrary to the case of the circuit in FIG. 3. This circuit, like that in FIG. 3, also transiently drives the transistor $Q_3$ serving as a bypass through the capacitor $C_1$.

Figure 6:
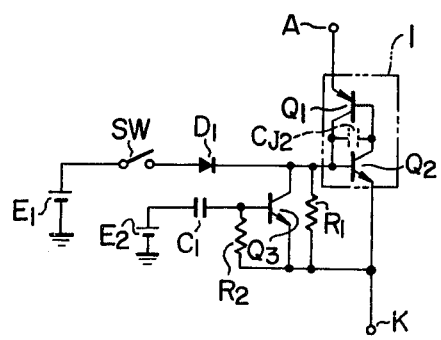
FIG. 6 is an equivalent circuit of a semiconductor switch as a fourth embodiment of the present invention.

FIG. 6 is an equivalent circuit of a semiconductor switch as a fourth embodiment of the present invention, in which the capacitor $C_1$ to drive the transistor $Q_3$ for preventing dv/dt effect is connected with a power source $E_2$ which is different from the power source $E_1$ to control the PNPN switch 1. In this way, the capacitive element for driving the transistor $Q_3$ can be connected at any suitable fixed potential. For example, the capacitive element can be connected with the earth or the anode terminal in case where the cathode potential is variable while the anode potential is fixed. Moreover, throughout the embodiments shown in FIGS. 3 to 6, the bypass capacitive element may be connected between the cathode and the cathode gate of the PNPN switch 1.

As described above, according to the present invention, by connecting a variable-impedance bypass circuit having a high impedance in the steady state and a low impedance in the transient state, between the cathode and the cathode gate or between the anode and the anode gate, of the PNPN switch, a semiconductor switch device can be obtained which is free from the erroneous closure due to the dv/dt effect under the influence of the stray capacitance of the gate control circuit without deteriorating the gate sensitivity and which has an excellent closing sensitivity and a high tolerance to dv/dt independent of the changes in the anode and the cathode potentials.

What we claim is:

1. A semiconductor switch device comprising:
   a PNPN switch having three PN junctions;
   a transistor;
   two impedance elements; and
   a capacitive element; and wherein
   one of said impedance elements is connected between the collector and the emitter of said transistor, the collector and the emitter of said transistor being connected across one of said three PN junctions at one end of said PNPN switch, said capacitive element being connected between the base of said transistor and a fixed potential so that only transient current is supplied to the base from the fixed potential; and wherein
   the other impedance element is connected between the base and emitter of said transistor.

2. A semiconductor switch device as claimed in claim 1, wherein said PNPN switch consists of a PNP transistor and an NPN transistor with the P collector and the N base of said PNP transistor so connected respectively with the P base and the N collector of said NPN transistor as to equivalently form a four-layer structure of P, N, P and N regions and to have three PN junctions.

3. A semiconductor switch device comprising:
   a PNPN switch having three PN junctions and having a P-type anode, an N-type base, a P-type base and an N-type cathode;
   a transistor;
   two impedance elements; and a capacitive element; and wherein on of said impedance elements is connected between the collector and the emitter of said transistor, the collector and the emitter of said transistor being respectively connected between the P-type base and the N-type cathode of said PNPN switch, said capacitive element being between the base of said transistor and a fixed potential so that only transient current is supplied to the base from the fixed potential, and the other impedance element being connected between the base and emitter of said transistor.

4. A semiconductor switch device as claimed in claim 3, wherein said capacitive element is a capacitor.

5. A semiconductor switch device as claimed in claim 3, wherein said capacitive element is a diode.

6. A semiconductor switch device comprising:
a PNPN switch having three PN junctions and having a P-type anode, an N-type base, a P-type base and an N-type cathode;
a transistor;
two impedance elements; and
a capacitive element; and wherein
one of said impedance elements is connected between the emitter and the collector of said transistor, the emitter and the collector of said transistor being respectively connected between the P-type anode and the N-type base of said PNPN switch, said capacitive element being connected between the base of said transistor and a fixed potential so that only transient current is supplied to the base from the fixed potential, and the other impedance element being connected between the base and emitter of said transistor.

7. A semiconductor switch device as claimed in claim 6, wherein said capactive element is a capacitor.

8. A semiconductor switch device as claimed in claim 6, wherein said capacitive element is a diode.

9. In a semiconductor switch device comprising a PNPN switch device having three PN junctions, a P-type anode, an N-type base, a P-type base and an N-type cathode, an anode electrode connected to said P-type anode to which an anode potential is supplied, a cathode electrode connected to said N-type cathode to which a cathode potential is supplied, and means for coupling a gate potential to one of said N-type base and said P-type base;

the improvement comprising means for preventing the erroneous firing of said PNPN switch in response to a transient change in the voltage across the anode and cathode of said PNPN switch during the removal of a gate potential to said one of said N-type base and said P-type base, said means comprising:

a controllable switching element having an input electrode, an output electrode and a control electrode, the state of conduction of said element between its input and output electrodes being dependent upon the application of a control signal to said control electrode, said input and output electrodes being connected across one of the PN junctions between said P-type anode and said N-type base and the PN junction between said N-type cathode and said P-type base, and control means, coupled to the control electrode of said element, for normally preventing conduction of said controllable switching element during steady state conditions across the anode and cathode of said PNPN switch, and for rendering said element conductive only upon a transient change in the voltage across the anode and cathode of said PNPN switch.

10. The improvement according to claim 9, wherein said control means comprises a capacitive element connected between said control electrode and a source of reference potential.

11. The improvement according to claim 10 wherein said switching element comprises a transistor having a base corresponding to the control electrode, an emitter corresponding to one of the input and output electrodes thereof and a collector corresponding to the other of the input and output electrodes thereof, and further comprising a first impedance element connected across the base and emitter of said transistor, and a second impedance element connected across the collector and emitter of said transistor.

* * * * *